US012588550B2

(12) United States Patent
Tripathi

(10) Patent No.: US 12,588,550 B2
(45) Date of Patent: Mar. 24, 2026

(54) INTEGRATED CIRCUIT INTERCONNECT WITH EMBEDDED DIE

(71) Applicant: Intel Corporation, Santa Clara, CA (US)

(72) Inventor: Santosh Tripathi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 902 days.

(21) Appl. No.: 17/475,681

(22) Filed: Sep. 15, 2021

(65) Prior Publication Data

US 2023/0080278 A1    Mar. 16, 2023

(51) Int. Cl.
H01L 25/065    (2023.01)
H01L 23/522    (2006.01)

(52) U.S. Cl.
CPC ...... H01L 25/0652 (2013.01); H01L 23/5226 (2013.01); *H01L 2225/06524* (2013.01)

(58) Field of Classification Search
CPC ..... H01L 21/6835; H01L 23/48; H01L 24/17; H01L 24/19; H01L 24/20; H01L 24/24; H01L 24/73; H01L 24/80; H01L 24/81; H01L 24/82; H01L 24/92; H01L 25/0657; H01L 25/50; H01L 2221/68327; H01L 2221/6834; H01L 2221/68354; H01L 2221/68368; H01L 2221/68381; H01L 2224/04; H01L 2224/05567; H01L 2224/08145; H01L 2224/13022; H01L 2224/131; H01L 2224/16145; H01L 2224/16147; H01L 2224/1703; H01L 25/0652; H01L 23/5226; H01L 2225/06524; H01L 23/522; H01L 23/5389; H01L 2224/06181; H01L 2224/214; H01L 2224/24137; H01L 2224/73251; H01L 2224/9222
See application file for complete search history.

(56) References Cited

U.S. PATENT DOCUMENTS

2018/0047674 A1*  2/2018  Tsai ........................ H01L 24/19
2019/0363079 A1*  11/2019  Thei ...................... H01L 23/481
2020/0006305 A1*  1/2020  Lambert ................. H01L 24/16
2020/0279813 A1*  9/2020  Liff .......................... H01L 24/19
2020/0286847 A1*  9/2020  Liu ..................... H01L 21/6835
2020/0286871 A1*  9/2020  Liff .................... H01L 21/4857

(Continued)

FOREIGN PATENT DOCUMENTS

WO        2017/052652 A1    3/2017

*Primary Examiner* — Thanh Y. Tran
(74) *Attorney, Agent, or Firm* — Arcane Law PLLC

(57) ABSTRACT

An integrated circuit includes a first die and a second die. The second die is embedded or otherwise contained in a layered interconnect structure of the first die. The second die can be an IC die or it can be an electrically inactive element, such as a heat spreader. A portion of the layered interconnect structure is laterally adjacent to the second die. A first part of the second die can be electrically connected to a second part of the second die via the interconnect structure of the first die. The second die can be operatively coupled to the first die using electrical connections between the second die and one or more interconnect layers above or below the second die, or to devices of the first die. A method of fabricating an interconnect structure with one or more embedded dies is also disclosed.

20 Claims, 6 Drawing Sheets

(56) References Cited

U.S. PATENT DOCUMENTS

| 2021/0272929 | A1* | 9/2021 | Tsai | H01L 23/5383 |
|---|---|---|---|---|
| 2021/0375707 | A1* | 12/2021 | Teixeira De Queiros | H01L 23/3128 |

* cited by examiner

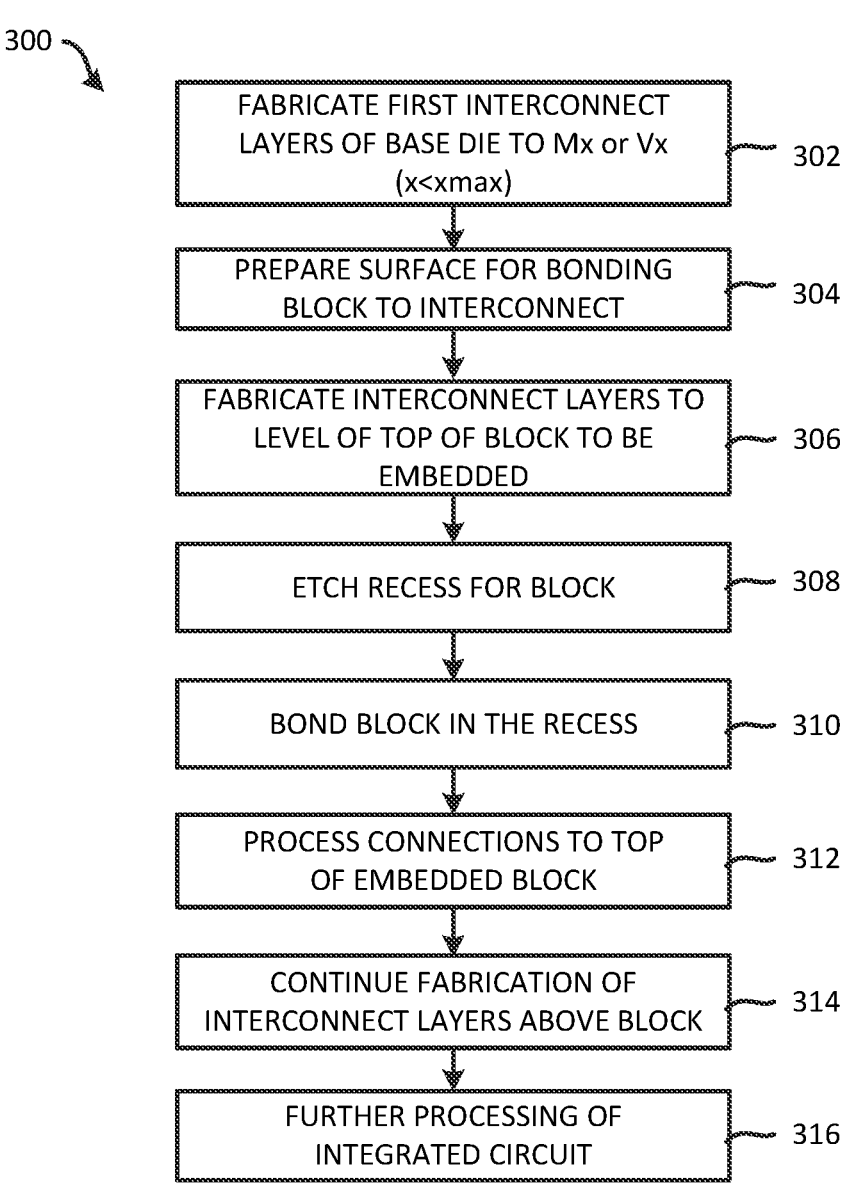

FABRICATE FIRST INTERCONNECT LAYERS OF BASE DIE TO Mx or Vx (x<xmax) — 302

PREPARE SURFACE FOR BONDING BLOCK TO INTERCONNECT — 304

FABRICATE INTERCONNECT LAYERS TO LEVEL OF TOP OF BLOCK TO BE EMBEDDED — 306

ETCH RECESS FOR BLOCK — 308

BOND BLOCK IN THE RECESS — 310

PROCESS CONNECTIONS TO TOP OF EMBEDDED BLOCK — 312

CONTINUE FABRICATION OF INTERCONNECT LAYERS ABOVE BLOCK — 314

FURTHER PROCESSING OF INTEGRATED CIRCUIT — 316

INTEGRATED CIRCUIT INTERCONNECT WITH EMBEDDED DIE

BACKGROUND

Integrated circuits (ICs) include electrical connections to devices and related components. Many of the electrical connections are made using interconnect structures in various metallization layers above the device layer of the IC. An interconnect structure is one way to make electrical connections between structures in different levels of an IC and may include conductive materials that extend horizontally within a metallization layer. Various metallization layers can be connected together using conductive vias that extend vertically through and between various metallization layers of the integrated circuit, such as to enable control over or use of corresponding portions of the IC. For example, contact pads on the surface of the integrated circuit may be connected to transistors at the device level by way of electrical pathways through various levels of the interconnect structure.

In some cases, multiple IC dies can be combined into a single package. Such an approach is useful to integrate dies of different materials such as silicon, germanium, silicon carbide, and Group III-V materials. This approach may be referred to as heterogeneous integration of die-to-die connections. Similarly, multiple dies being may be connected together in a single package when the dies are fabricated using different technology nodes (e.g., 22 nm, 14 nm, 10 nm, etc.) or when the dies were fabricated by different fabricators.

BRIEF DESCRIPTION OF THE DRAWINGS

FIG. 3 illustrates a method of fabricating an interconnect structure, in accordance with some embodiments.

Figure 1:
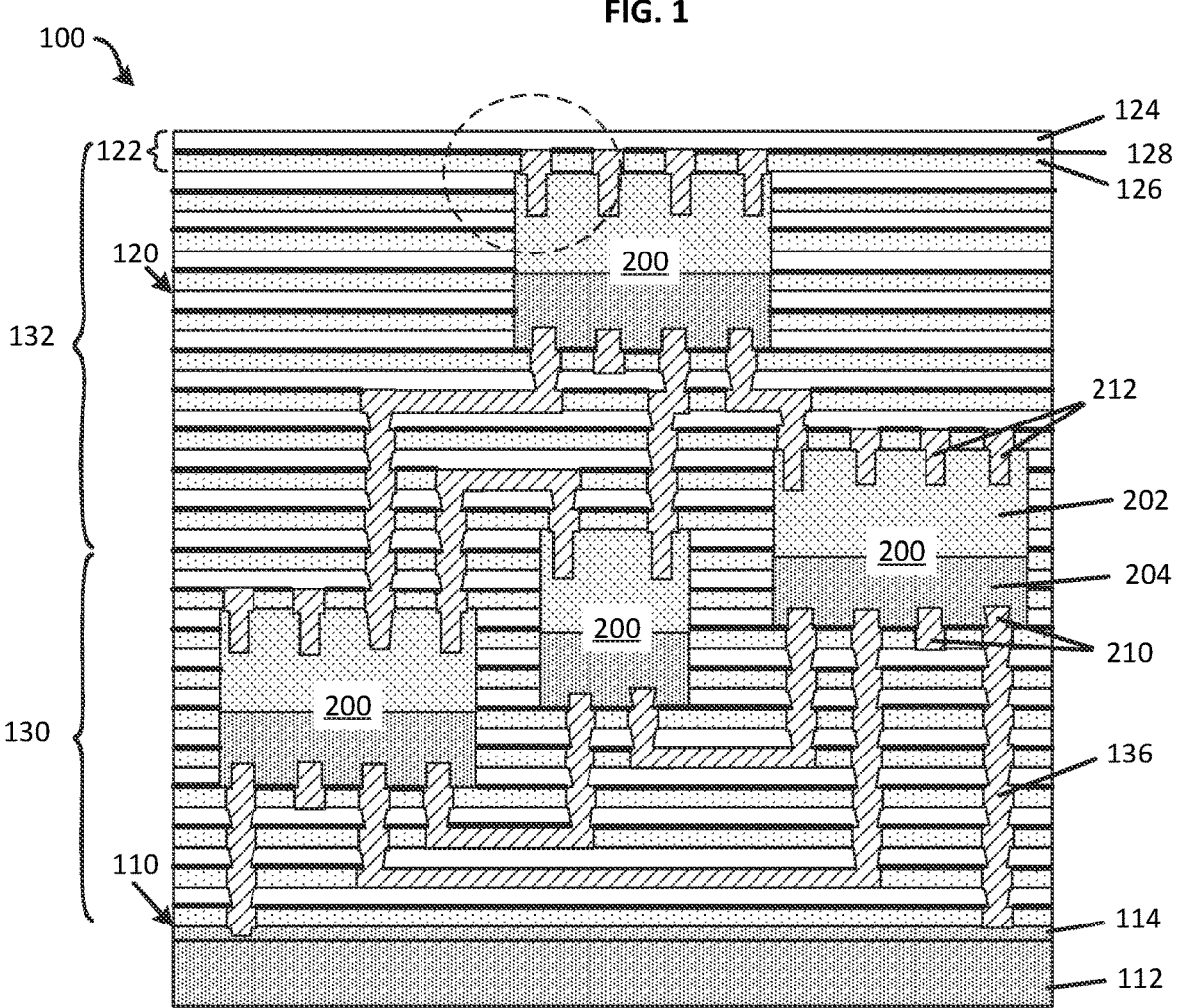
FIG. 1 is a cross-sectional view of an integrated circuit that includes a base die with a plurality of secondary dies or blocks embedded in the interconnect of the base die, in accordance with an embodiment of the present disclosure.

The figures depict various embodiments of the present disclosure for purposes of illustration only. Numerous variations, configurations, and other embodiments will be apparent from the following detailed discussion. Note that the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; the same goes for other layer or feature dimensions.

DETAILED DESCRIPTION

Disclosed are structures and methodologies for an integrated circuit interconnect with one or more embedded secondary dies. In one example, an integrated circuit includes a secondary die embedded in a layered interconnect structure of a base die. The secondary die is smaller than the base die, and it can be entirely contained with the layered interconnect structure. Each of the dies may include its own device layer and interconnect structure, in some embodiments. For example, the secondary die includes a semiconductor base and layers of interconnect on the semiconductor base. In other embodiments, a particular die is embedded in the interconnect layers of the base die, but the embedded die is not electrically connected to the base die. In one such embodiment, the embedded die is a heat spreader. Electrical connections can be made between the secondary die and one or more interconnect layers below the secondary die. Electrical connections can be made between the secondary die and one or more interconnect layers above the secondary die. The interconnect structure of the base die can include, for instance, conductive vias and conductive horizontal lines in the interconnect layers laterally adjacent the embedded secondary die. In some such example cases, a portion of the interconnect structure of the base die is adjacent to each side of the second die. In some embodiments, the interconnect structure of a base die can include two or more embedded secondary dies, in the same plane and/or different planes.

A secondary die can be a self-contained block, such as a memory structure. In other embodiments, one or more of the secondary die(s) can be a partially built block, such as one that attains its intended function when electrically coupled to another block located in the interconnect structure or to a device in the device layer of the base die, for example. In yet other embodiments, the secondary die can be a heat spreader or other electrically inactive block that does not require electrical connections to the base die. Numerous variations will be apparent in light of this disclosure.

General Overview

Conventionally, top and base dies have been connected together between top and/or bottom surfaces of the structures in a face-to-face configuration. For example, the top surfaces of two dies can be oriented to face one another and then bonded by way of a dielectric layer. Similarly, the bottom surfaces of two dies can be bonded to one another, or a top surface of one component can be bonded to the bottom surface of another component. However, the conventional bonding scheme imposes limitations on the usefulness of heterogenous integration. Therefore, a need exists for improved methods of integrating one die with another.

The present disclosure addresses this need and others by providing structures and methodologies for integrating one or more secondary die into the interconnect layers of an integrated circuit base die. In one embodiment, a self-contained or partially built building block can be embedded within the interconnect layers of the base die. One methodology includes etching a pocket within the interconnect layers of the base die and placing and bonding the block into the etched pocket. The top and bottom surfaces of the embedded die or block can be electrically connected to the interconnect structure of the base die. Additionally, regions laterally adjacent to the embedded die can include both horizontal and vertical interconnect as well as connections to other dies.

The present disclosure can be applied to one or more secondary die each comprising logic, memory, inductor, resistor, capacitor, heat sink/pad/pipe, or other electrically active or inactive structure. Depending upon function of the die to be embedded, it can be embedded in interconnect layers that are closer to the device layer of the base die or in upper levels of the interconnect structure without limiting the number of metal layers on the base die. In one example, a memory block can be placed closer to the device layer of the base die to boost system performance. An embedded block can communicate with another embedded block and/or with the base die through higher interconnect density.

In accordance with some embodiments, both top and bottom surfaces of the embedded blocks are available for high density interconnects. The interconnect density on the top surface is limited by lithography techniques rather than the ability to establish mechanical connection, potentially improving the interconnect density by a few orders of magnitude.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, TEM can be useful to show a cross section of an integrated circuit or die that includes an interconnect structure with one or more embedded blocks or dies contained within one or more layers of that interconnect structure.

As discussed herein, terms referencing direction, such as top, bottom, vertical, horizontal, side, left, right, front, back, etc., are used for convenience to describe embodiments of integrated circuit structures having a base or substrate extending in a horizontal plane. Embodiments of the present disclosure are not limited by these directional references and it is contemplated that an integrated circuit and interconnect structures in accordance with the present disclosure could be used in any orientation.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Example Structures

FIG. 1 illustrates a cross-sectional view of an integrated circuit 100 that includes a base die 110 and multiple secondary dies 200 embedded in the interconnect structure 120 of the base die, in accordance with an embodiment of the present disclosure. The base die 110 includes a base 112 that includes a device layer 114. An interconnect structure 120 is above the device layer 114 and includes multiple interconnect layers 122, each of which includes a dielectric layer 124 and a conductor layer 126. In some embodiments, such as shown in this example, each interconnect layer 122 optionally includes an etch stop layer 128 between the dielectric layer 124 and the conductor layer 126. The conductor layer 126 typically is a metal layer, but conductor layer 126 is not limited to metals.

Although the base die 110 in this example includes twenty interconnect layers 122, more or fewer interconnect layers 122 can be used. Additionally, the interconnect layers 122 can be generally grouped as local interconnect layers 130 or global interconnect layers 132. Local interconnect layers typically connect together circuit elements in the device layer 114. Global interconnect layers 132 typically connect together circuit blocks and connect power supplies to the interconnect structure 120. Vias 136 are conductive paths that extend vertically through the interconnect structure 120 and connect a conductor layer 126 of one interconnect layer 122 to a conductor layer 126 of another interconnect layer 122. Note also that while the interconnect layers 122 appear to have the same thickness as shown in FIG. 1, individual interconnect layers 122 typically increase in thickness and have greater feature spacing moving upward in the interconnect structure 120 from the device layer 114, as will be appreciated.

In accordance with some embodiments, the integrated circuit (IC) 100 can include one or more secondary dies 200 embedded in the interconnect structure 120 of the base die 110. The example IC 100 of FIG. 1 includes four secondary dies 200. In some embodiments, an individual secondary die 200 includes a semiconductor base 202 and layers of interconnect 204 on the semiconductor base 202. The semiconductor base 202 typically includes devices on the semiconductor base.

One or more first electrical connections 210 can be made between the secondary die 200 and layers of interconnect 204 below the secondary die 200. For example, the interconnect structure 120 of the base die 110 can be electrically connected to the secondary die 200. In this example, layers of interconnect 204 comprise the bottom portion of the secondary die 200. In other words, the layers of interconnect 204 of the secondary die 200 are between the semiconductor base 202 of the secondary die 200 and the device layer 114 of the base die 110. Stated yet another way, when the layers of interconnect 204 of the secondary die 200 are considered part of the top portion of the secondary die 200, the secondary die 200 is oriented top-down when placed in the interconnect structure 120 of the base die 110. The secondary die 200 can also be bonded to the interconnect structure 120 throughout the bottom and/or top surface of the secondary die 200. For example, a polymer adhesive bonds the secondary die 200 to the interconnect structure 120.

One or more second electrical connections 212 can be made between the secondary die 200 and interconnect layers 122 above the secondary die 200. For example, the semiconductor base 202 of the secondary die 200 and the interconnect structure 120 of the base die 110 can be electrically connected. In this example, the secondary die 200 is oriented such that the semiconductor base 202 of the secondary die 200 is part of the top or upper portion of the secondary die 200. In other words, the top surface of the secondary die 200 can be a surface of the semiconductor base 202. The secondary die 200 can have one or more second electrical connections 212; four second electrical connections 212 are shown for some secondary dies 200 in this example.

The secondary die 200 may also referred to as an embedded block and can be or include a logic circuit, a memory structure, an inductor, a resistor, a capacitor, a heat sink/ pad/pipe, or any other type of electrically active or inactive structure. In some embodiments, one or more secondary die 200 is a self-contained block. In some embodiments, one or more secondary die 200 is a partially built block. Integrated circuit 100 can include a combination of self-contained blocks and partially built blocks, in accordance with some embodiments. A self-contained block is electrically connected to one or more other embedded blocks, to the base die 110, or to separate devices for input/output, control signal, and power. In contrast, a partially built block has electrical connections to the embedding media (e.g., interconnect layers 122 of the base die 110), to other embedded blocks, to devices on the base die, and to the external world for purposes other than input/output, control signal, and power. A partially built block requires another block or interconnect layers of the base die to complete the block and enable the block to function as intended. Examples of partially built blocks include portions of a large memory or computing complex that is difficult to build monolithically or cannot be built monolithically due to yield or other considerations.

The distinction between a self-contained block and a partially built block can be illustrated using an example of an inverter circuit, which includes a pair of transistors in addition to other components, depending on the application. The inverter circuit is discussed in this example for its simplicity; however, it is contemplated that partially built block would more likely involve a circuit of greater complexity and/or size. A self-contained inverter block includes both transistors built within the block in addition to all electrical connections made for it to function as an inverter. The self-contained inverter block can function as an inverter when connected to the remaining elements through its input/output and power/ground connections. In contrast, a partially built inverter block can have both of its transistors built within the block, but the block might require the base die's interconnect structure to connect the two transistors in an inverter configuration. In another example, one transistor of the inverter circuit is built on one block and another transistor of the inverter circuit is built on another block, where the two transistors are connected in inverter configuration through interconnect layers of the base die.

In the example of FIG. 1, secondary dies 200 are electrically connected to one another via the interconnect structure 120. Additionally, some of the secondary dies 200 are electrically connected to devices on the device layer 114 of the base die 110. A secondary die 200 can be connected to the outside world via the interconnect structure 120 and suitable electrical contacts that are accessible to make connections with other ICs or electronic devices, for example.

As illustrated in FIG. 1, any one or more of the secondary dies 200 can be partially built blocks. In one example, a particular secondary die 200 is a partially built block, where one part of the secondary die 200 is electrically connected to another part of the same secondary die 200 via the interconnect structure. Some such partially built blocks can be detected using cross-sectional SEM or TEM imaging. In another example, a secondary die 200 is electrically connected to one or more other secondary die 200 via the interconnect structure 120. In another example, a secondary die 200 is electrically connected to devices in the device layer 114. Combinations of such connections can be realized in some embodiments. A partially built block of a secondary die 200 embedded in the interconnect structure 200 connected to another embedded secondary die 200 or to device(s) on the device layer 114 can be detected, for example, by analyzing input and output signals.

Figure 2:
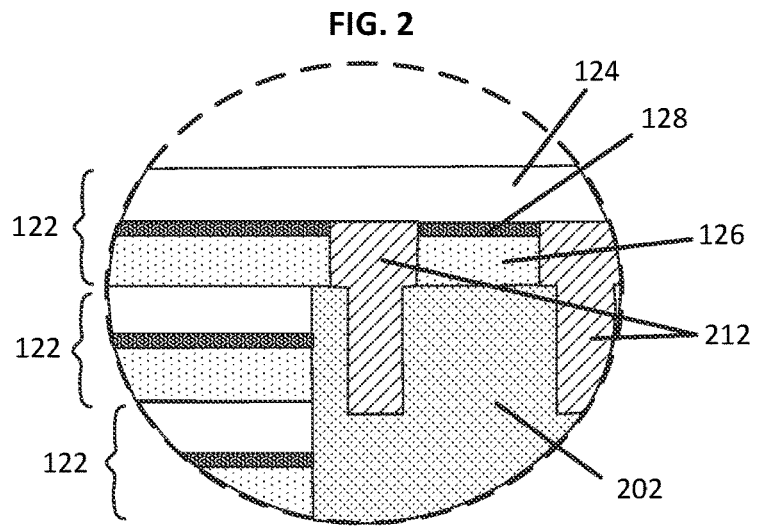
FIG. 2 is an enlarged illustration of the circled region near the top of FIG. 1.

FIG. 2 illustrates an enlarged view of the circled region near the top of FIG. 1. The region shown in FIG. 2 includes portions of three interconnect layers 122, each of which includes a dielectric layer 124, a conductor layer 126, and an etch stop layer 128 between the dielectric layer 124 and the conductor layer 126. Second electrical connections 212 into the semiconductor base 202 of the secondary die 200 and occupy part of the conductor layer 126 and etch stop layer 128 of the interconnect layer 122. In this example, a dielectric layer 124 overlays the top of the second electrical connections 212 and etch stop layer 128.

FIG. 3 illustrates processes in a method 300 of fabricating an interconnect structure that includes one or more embedded secondary die, in accordance with some embodiments. Along with the discussion of each process flow, example structures at various stages of processing will be discussed with reference to FIGS. 4A-4G. Note that the processes in method 300 are shown in a particular order for ease of description. However, one or more of the processes may be performed in a different order or may not be performed at all (and thus be optional), in accordance with some embodiments. Processes described above are not exhaustive and some processes may include additional processing, such as lithography, deposition of isolation layers, cleaning, planarization, and other processes, as will be appreciated.

In general, method 300 can be performed using any suitable semiconductor fabrication techniques, including deposition, photolithography, wet or dry chemical etching processes (e.g., atomic layer etch, plasma etch, wet etch), chemical mechanical polishing (CMP), deposition or epitaxial growth processes (e.g., CVD, PVD, ALD, VPE, MBE, LPE), and/or any other suitable processing, as will be appreciated.

Examples of dielectric materials include silicon dioxide ($SiO_2$), silicon nitride ($Si_3N_4$), aluminum nitride (AlN), aluminum oxide ($Al_2O_3$), gallium oxide (GaO), zinc oxide (ZnO), titanium dioxide ($TiO_2$), zirconium dioxide ($ZrO_2$), and hafnium dioxide ($HfO_2$). The dielectric can be deposited by spin coating or blanket deposition, for example. The dielectric can be an insulator, passivation material, other suitable material. After deposition, the dielectric layer optionally can be recessed or planarized to be coplanar with the top surface of the vias or other structure, such as by chemical mechanical polishing (CMP).

Dielectric materials can be etched using dry etch or wet etch methods. For example, a vapor phase etch process includes heating the substrate, typically to between 150-400° C. under reduced pressure, and then exposing the substrate to one or more vapor phase species alternating with purge steps to remove volatile etch products. In the case of some materials, a chemical vapor etch may be employed involving the introduction of a vapor phase etchant followed by a purge to remove unused etchant and volatile etch products. For example, $TiO_2$ can be removed through vapor phase exposure to a fluorinating agent such as anhydrous hydrogen fluoride (HF). In other embodiments, two or more vapor phase reagents are used for removal of the spacer material using self-limiting surface reactions constituting an atomic layer etch (ALE) process. These processes typically involve a surface activation step which may be a chemical oxidation using oxygen ($O_2$), ozone ($O_3$), hydrogen peroxide ($H_2O_2$), or oxygen ($O_2$) plasma, or a halogenating reagent such as fluorine ($F_2$), nitrogen trifluoride ($NF_3$) plasma, xenon difluoride ($XeF_2$), germanium tetrafluoride ($GeF_4$), sulfur tetrafluoride ($SF_4$), chlorine ($Cl_2$), germanium tetrachloride ($GeCl_4$), silicon tetrachloride ($SiCl_4$), or thionyl chloride ($SOCl_2$), followed by a purge step. This activated surface layer is converted into a volatile etch species through the introduction of new ligands by a second etch reagent, which may be a halogen or an organic ligand, followed by a purge step.

Conductive vias, lines, and layers can be made from a wide range of metals, alloys, or other conductive materials, including polysilicon, aluminum (Al), silver (Ag), gold (Au), cobalt (Co), ruthenium (Ru), tungsten (W), titanium (Ti), tantalum (Ta), copper (Cu), titanium nitride (TiN), or tantalum nitride (TaN), for example. Conductive materials can be deposited using thermal evaporation, atomic layer deposition (ALD), or other suitable technique.

Method 300 of FIG. 3 begins with fabricating 302 first layers of interconnect structure on the base die to a metal level $M_x$ at the bottom of the IC die to be embedded, where metal level Mx is lower than the highest metal level Mmax. For example, metal level Mx can be the sixth metal layer M6 of the interconnect structure. The base die can be any suitable integrated circuit die. The base die typically includes a device layer on a base or substrate. For example, the base can include one or more layers of semiconductor material on a substrate, such as a semiconductor wafer. In another example, the base comprises a bulk semiconductor wafer (e.g., silicon) in addition to optional oxide layers and layers of semiconductor material (e.g., III-V semiconductor material) on the wafer.

In some embodiments, an individual interconnect layer includes a conductor layer (e.g., metal), a dielectric layer on the metal layer, and an etch-stop layer between the conductor and dielectric layers. An individual interconnect layer may also include a diffusion barrier, in some embodiments. Fabricating the first layers of interconnect is performed up to the layer where a die will be bonded. In one example, four layers of interconnect are deposited in anticipation of bonding a secondary die to the fourth interconnect layer (e.g., at M4). Fabricating 302 first interconnect layers typically includes patterning and etching metal layers to define horizontal and vertical connections. Such connections can electrically connect devices in the device level of the base die.

Figure 4A:
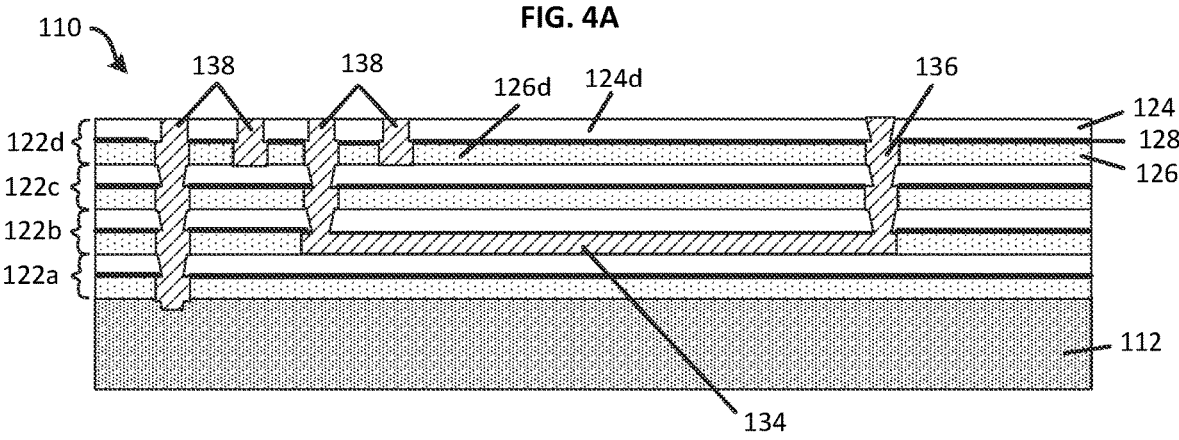
FIGS. 4A-4G illustrate cross-sectional views of an interconnect structure at various stages of fabrication according to the method of FIG. 3, in accordance with some embodiments of the present disclosure.

FIG. 4A illustrates a cross-sectional view of a base die 110 with first layers of interconnect structure 120. Individual interconnect layers 122 of interconnect structure 120 include a conductor layer 126, a etch stop layer 128, and a dielectric layer 124. Vias 136 extend between and electrically connect conductive layers 126 of different interconnect layers 122. The base die 110 includes conductive lines 134 extending horizontally within one or more conductive layers 126. In this example, the base die 110 includes four first layers 122a-122d. the four first layers are fabricated in preparation for bonding a secondary die to the fourth interconnect layer 122d. As such, contacts 138 to conductive layer 126d are exposed through dielectric layer 124d.

Method 300 continues with preparing 304 the surface for bonding the secondary die to the top-most interconnect layer that was fabricated in process 302. A variety of techniques are available for preparing 304 the surface. In one example, a dielectric adhesive is deposited and patterned in the region of the die to be bonded. In one such embodiment, a benzocyclobutene (BCB) film is deposited, which has a glass transition temperature >350° C. Other bonding options include Cu/Sn eutectic bonding, low-temperature Cu—Cu thermocompression bonding, and hybrid bonding using a combination of such methods. The details of preparing 304 the surface can be selected for the particular type of bonding to be used, as will be appreciated.

Figure 4B:
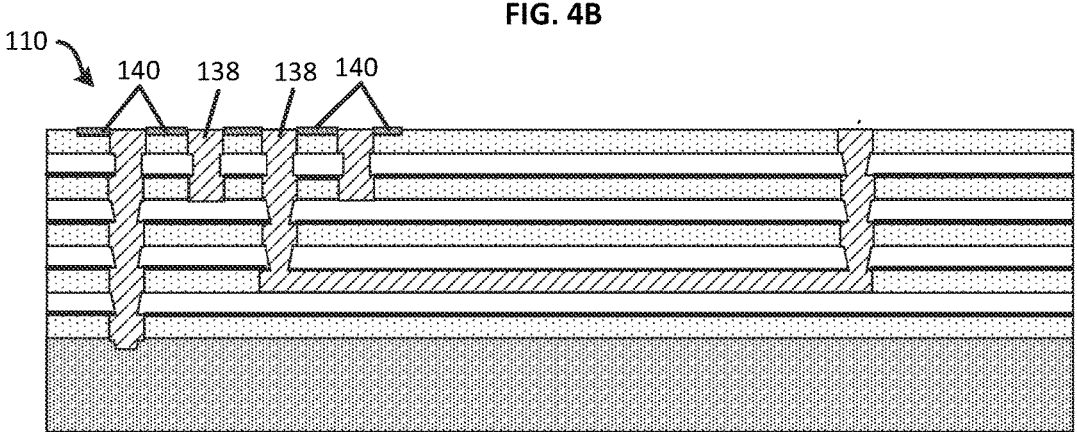

FIG. 4B illustrates the base die 110 of FIG. 4A after depositing a polymer adhesive 140 on the top surface of dielectric layer 124d in the region of the secondary die to be bonded. Note that in this example the polymer adhesive 140 is between and to the sides of contacts 138, leaving the top surface of the contacts 138 exposed.

Method 300 continues with fabricating 306 interconnect layers 122 up to the level corresponding to the top of the embedded die. Process 306 includes omitting metal and etch-stop material in the region 142 of the secondary die to be embedded, in some embodiments. A dielectric material can be deposited in place of the metal and etch stop material in region 142. In embodiments having a first embedded die and a second embedded die where part of the second embedded die occupies some of the same interconnect layers 122 as the first embedded die, fabricating 306 interconnect layers 122 to the level of the top of the first embedded die includes processed 302 and 304 as needed for the second embedded die.

Figure 4C:
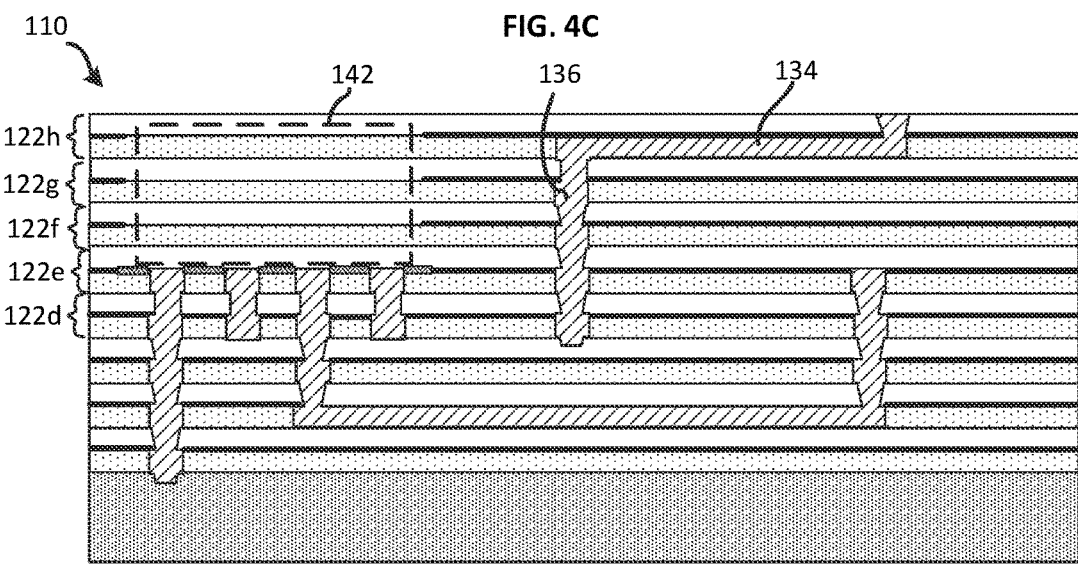

FIG. 4C illustrates an example structure after fabricating interconnect layers 122 up to or slightly above the top of the die to be embedded. In this example, interconnect layers 122e-122h have been fabricated. Note that interconnect layers 122e-122h lack an etch stop layer 128 in the region 142 corresponding to the die to be bonded, which is shown in broken lines in FIG. 4C. Note also that interconnect layers 122e-122h, laterally adjacent the region 142 of the die to be bonded, can include one or more vias 136 and/or horizontal conductive lines 134. As such, the interconnect structure 120 can include vias 136 and/or conductive lines 134 in interconnect layers 122 that contain the embedded die 200.

Method 300 continues with etching 308 a recess through interconnect layers fabricated in process 306 in the region of the die to be bonded. In some embodiments, process 308 includes exposing metal contacts and bonding material (e.g., polymer adhesive) at the bottom of the recess for making electrical connections to the die to be bonded. In other embodiments, etch stop layers in the region of the embedded die can be selected to involve a different etch chemistry than the etch stop layer immediately below the embedded die. Such an approach would facilitate an etch process that stops at the etch stop layer immediately below the die to be embedded. In yet other embodiments, etch stop layers are optional, such as when etch processing is sufficiently precise.

Figure 4D:
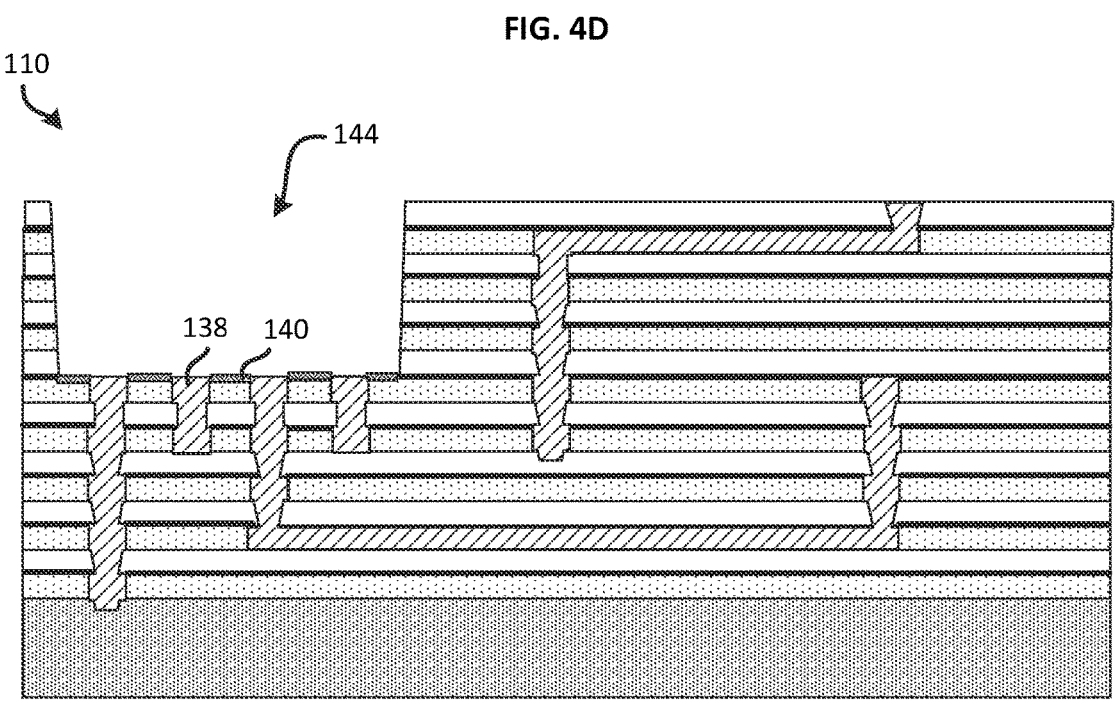

FIG. 4D illustrates base die 110 after etching 308 a recess 144 for the die to be bonded. In this example, contacts 138 and polymer adhesive 140 are exposed at the bottom of the recess 144. In some embodiments, etching 308 is performed using a dry etch process.

Method 300 continues with aligning, placing, and bonding 310 the die in the recess defined in process 308. As noted above, process 310 depends upon the bonding mechanism selected. Typically, however, bonding 310 the die is performed at an elevated temperature, such as a temperature to soften or liquefy the polymer adhesive or metal contact pads. Optionally, bonding 310 can include applying pressure to the placed die. In some embodiments, both elevated temperature and pressure are needed to establish mechanical and electrical bonding. After processing first or bottom contacts 138 to the bottom surface of the placed die, an interlayer dielectric (ILD) is deposited to fill remaining space in the recess and then the ILD is planarized.

Figure 4E:
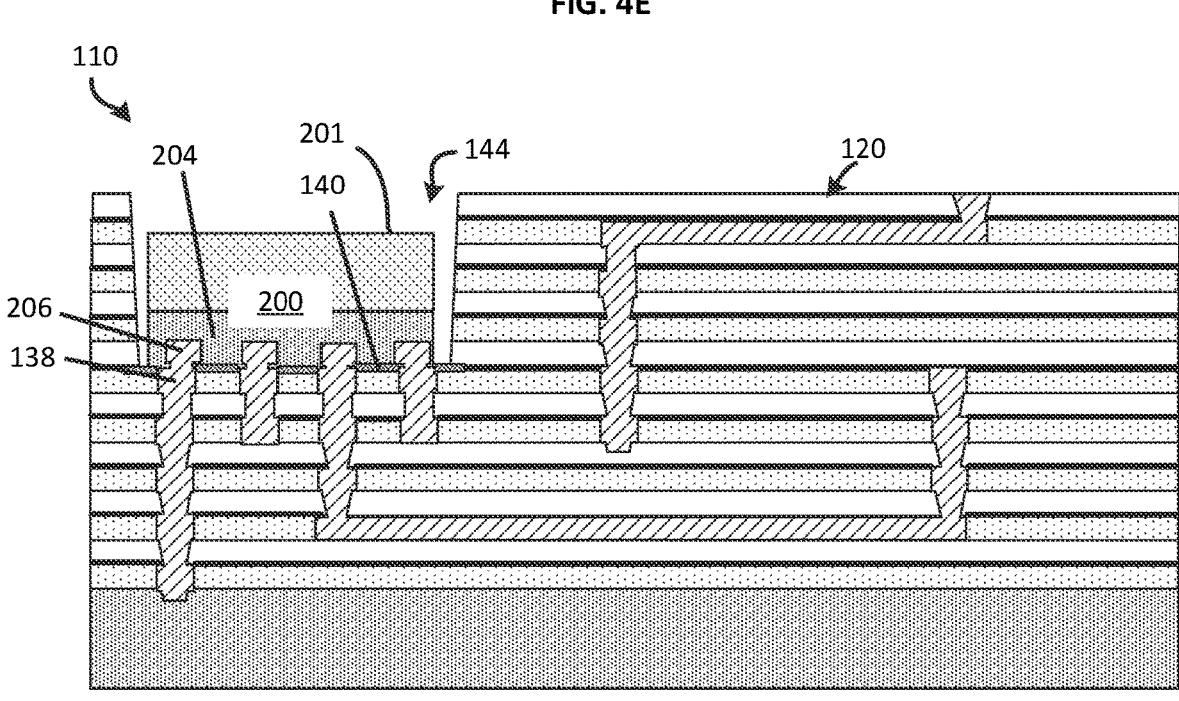

FIG. 4E illustrates base die 110 after placing and bonding 310 a secondary die 200 in the recess 144. In this example, bottom contacts 138 are electrically connected to the layers of interconnect 204 at the bottom of the secondary die 200. In this example, the secondary die 200 is placed interconnect-side-down in the recess 144. In other embodiments, the secondary die 200 is placed interconnect-side-up in the recess 144. In addition to electrical connections via the first or bottom contacts 138, the secondary die 200 is mechanically secured in the recess 144 by adhesion with polymer adhesive 140. In the example of FIG. 4E, the top surface 201 of the secondary die 200 is illustrated as being below the top surface of the surrounding interconnect structure 120. Note that this condition is not required and the top surface 201 of the secondary die 200 can be flush with or substantially flush with the top surface of the interconnect structure 120 (e.g., ±5% of thickness of the dielectric layer at the top of the embedded die).

Method 300 continues with processing 312 top or second contacts to the top of the bonded die or slightly above the top of the bonded die. In some embodiments, processing 312 top contacts follows filling the open space in the recess with ILD, then planarizing using CMP. Contact openings can then be patterned and etched in the ILD (if present on top of the secondary die 200) to a depth that extends to or into the bonded die. In some embodiments, such as when the secondary die is placed interconnect-side-down in the recess, the contact openings are etched into the semiconductor base of the bonded die. The contact openings can then be filled with conductive material (e.g., copper), then planarized using CMP to be flush with the top surface of the interconnect layer 122h. In some embodiments, the top surface of the secondary die 200 includes one or more hooks configured for electrical connection, where top contacts 206 are made to the hooks.

Figure 4F:
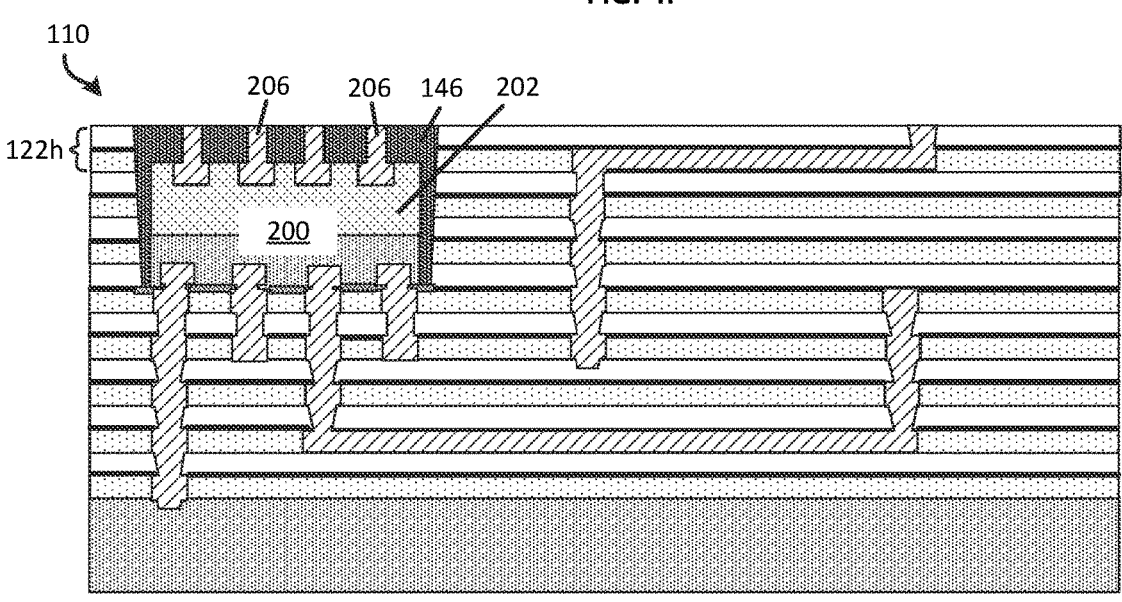

FIG. 4F illustrates the base die 110 with embedded secondary die 200 after processing top contacts 206 to the secondary die 200. In this example, the top contacts 206 contact the semiconductor base 202 of the secondary die 200. In other embodiments, the secondary die 200 is oriented with its interconnect layers on top, so that top contacts 206 are made with the interconnect layers of the secondary die 200. As can be seen in FIG. 4F, for example, ILD 146 is between secondary die 200 and interconnect layers 122. Specifically, ILD 146 is between the sides of the secondary die 200 and the laterally adjacent interconnect layers 122, in addition to being and along the top of the secondary die 200 below the next interconnect layer 122.

Method 300 continues with fabricating 314 one or more interconnect layers above the embedded secondary die. Fabricating 314 interconnect layers can continue as described above for first interconnect layers, including fabrication of vias 136 and conductive lines 134 as needed.

Figure 4G:
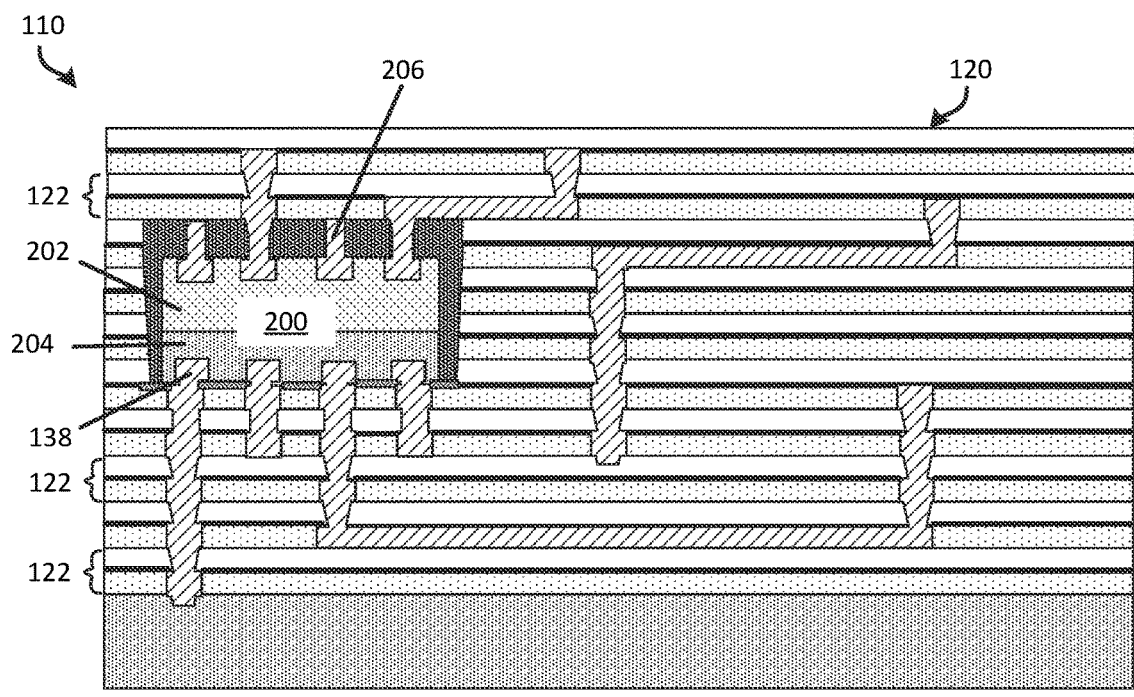

FIG. 4G illustrates base die 110 with secondary die 200 embedded in the interconnect structure 120. The interconnect structure 120 includes bottom contacts 138 between interconnect layers 122 below the secondary die 200 and layers of interconnect 204 of the secondary die 200, and also including top contacts 206 between interconnect layers 122 above the secondary die 200 and the semiconductor base 202 of the secondary die.

Some or all of processes 302-314 can be repeated as needed to embed additional secondary blocks in the interconnect structure. In some embodiments, method 300 results in interconnect structure 120 that includes a plurality of secondary dies 200. In some such embodiments, embedded secondary dies 200 can occupy at least some of the same interconnect layers 122. In other embodiments, secondary dies 200 occupy different interconnect layers 122 in the interconnect structure 120.

Method 300 optionally continues with completing 316 an integrated circuit, which may include making electrical connections to power supply or other circuits, packaging the integrated circuit die, and other processing, for example. Numerous embodiments and variations will be apparent in light of the present disclosure.

Example System

Figure 5:
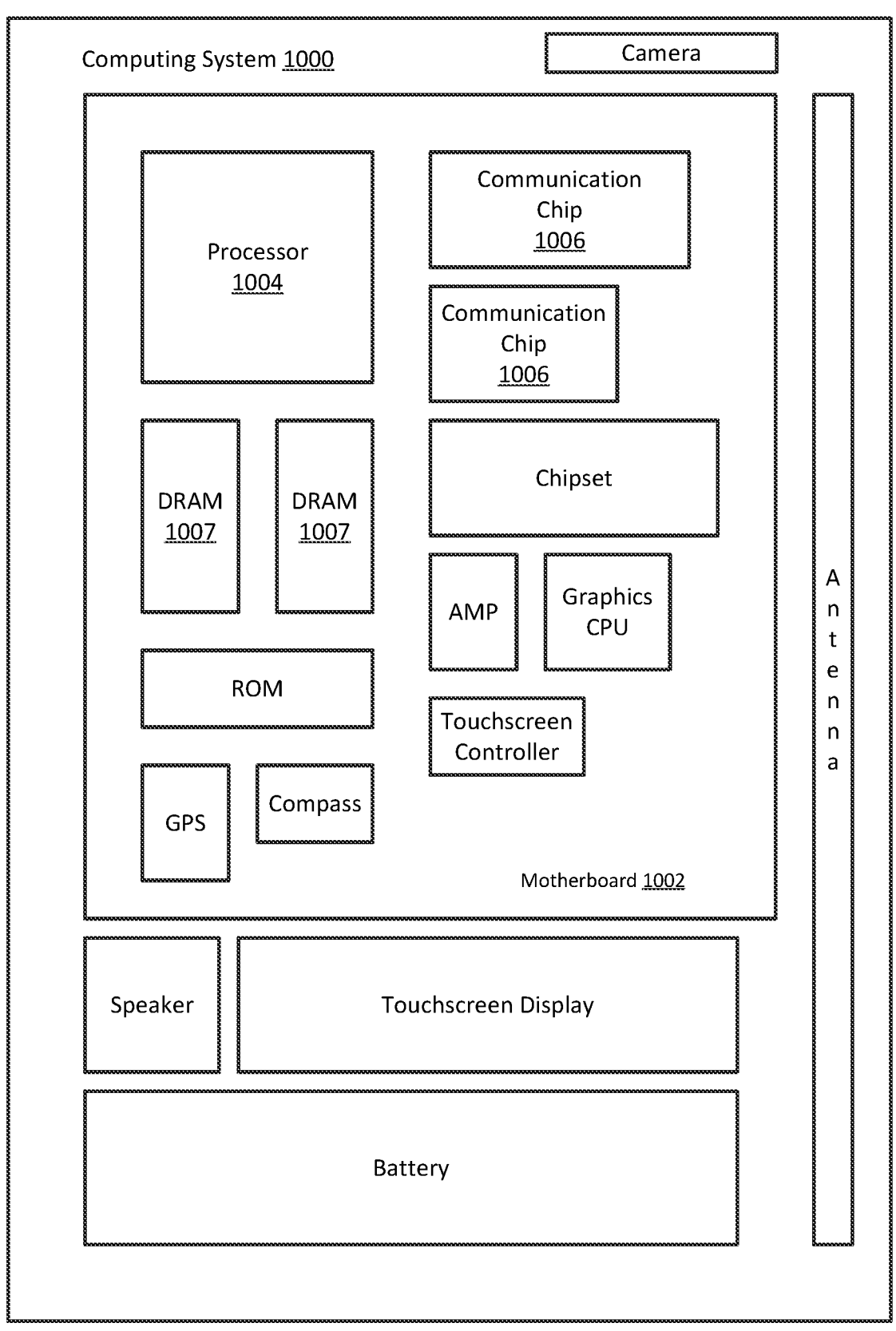
FIG. 5 illustrates a computing system implementing interconnect structures, in accordance with an embodiment of the present disclosure.

FIG. 5 illustrates an example computing system 1000 implemented with one or more of the interconnect structures disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. The interconnect structure of the motherboard can include one or more embedded secondary dies, in accordance with some embodiments.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), a photodetector, a multimode interferometer, and so forth). Any of the components included in computing system 1000 may include one or more integrated circuit structures, interconnect structures, or devices configured in accordance with an example embodiment (e.g., to include waveguides fabricated using a combination of different cladding materials as variously provided herein). In some embodiments, multiple functions can be integrated into one or more chips (e.g., for instance, note that the communication chip 1006 can be part of or otherwise integrated into the processor 1004). In some embodiments, multiple functions can be accomplished at least in part by utilizing embedded secondary dies in the interconnect structure of a base die.

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures having a gate stack an access region polarization layer as variously described herein.

The processor 1004 of the computing system 1000 includes an integrated circuit die packaged within the processor 1004. The integrated circuit die can include one or more embedded secondary dies, such as a memory die. In some embodiments, the integrated circuit die includes onboard circuitry that is implemented with one or more interconnect structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more interconnect structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, an ultra-mobile PC, a mobile phone, a desktop computer, a server, a printer, a scanner, a monitor, a set-top box, an entertainment control unit, a digital camera, a smart display, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising one or more first interconnect layers; a die in the one or more first interconnect layers, the die including a semiconductor base and one or more second layers of interconnect over the semiconductor base; first electrical connections between the die and one or more of the first interconnect layers below the die; and second electrical connections between the die and one or more of the first interconnect layers above the die.

Example 2 includes the subject matter of Example 1, wherein individual first interconnect layers include insulator material and one or more conductive features within the insulator material.

Example 3 includes the subject matter of Example 2, wherein the individual first interconnect layers further include an etch-stop layer.

Example 4 includes the subject matter of any one of Examples 2 or 3, wherein the one or more conductive features comprises copper.

Example 5 includes the subject matter of any one of Examples 1-4, wherein a thickness of the die is from 3 microns to 100 microns, including from 10 microns to 40 microns.

Example 6 includes the subject matter of any one of Examples 1-5, further comprising an interlayer dielectric between the die and the one or more first interconnect layers laterally adjacent the die.

Example 7 includes the subject matter of any one of Examples 1-6, wherein the die is a second die and the integrated circuit includes a first die below the one or more first interconnect layers, wherein the one or more first interconnect layers includes one or more local interconnect layers and the second die is in the one or more local interconnect layers, wherein there is no other interconnect layer between a local interconnect layer and the first die.

Example 8 includes the subject matter of any one of Examples 1-6, wherein the die is a second die and the integrated circuit includes a first die below the one or more first interconnect layers, wherein the one or more first interconnect layers includes one or more local interconnect layers and one or more global interconnect layers and the second die is in the one or more global interconnect layers, wherein there is no other interconnect layer between a local interconnect layer and the first die, and global interconnect layer is above a local interconnect layer.

Example 9 includes the subject matter of any one of Examples 1-8, wherein the one or more first interconnect layers includes one or more first interconnect layers above the die.

Example 10 includes the subject matter of any one of Examples 1-9, wherein the bottom portion of the die comprises the one or more second layers of interconnect layers.

Example 11 includes the subject matter of any one of Examples 1-10, wherein the semiconductor base of the die comprises a bulk semiconductor.

Example 12 includes the subject matter of Examples 10, wherein the bulk semiconductor comprises a Group III-V semiconductor material.

Example 13 includes the subject matter of Examples 10, wherein the bulk semiconductor comprises a Group IV semiconductor material.

Example 14 includes the subject matter of any one of Examples 1-10, wherein the semiconductor base is a second semiconductor base and includes a second device layer, the integrated circuit further comprising a first semiconductor base below the one or more first interconnect layers, wherein the first semiconductor base includes a first device layer that comprises single crystal silicon.

Example 15 includes the subject matter of any one of Examples 1-10, wherein the die is a second die, and wherein the semiconductor base is a second semiconductor base and includes a second device layer, the integrated circuit further comprising a first die including the one or more first interconnect layers and a first semiconductor base that includes a first device layer, the first semiconductor base below the one or more first interconnect layers, wherein the first semiconductor base comprises a first semiconductor material and the second semiconductor base of the second die comprises a second semiconductor material that is compositionally distinct from the first semiconductor material.

Example 16 includes the subject matter of Example 15, wherein the first semiconductor material comprises a Group IV material and the second semiconductor material comprises a Group III-V material.

Example 17 includes the subject matter of any one of Examples 1-10, wherein the die is a second die, and wherein the semiconductor base is a second semiconductor base and includes a second plurality of semiconductor devices, the integrated circuit further comprising a first die including the one or more first interconnect layers and a first semiconductor base that includes a first device layer, the first semiconductor base below the one or more first interconnect layers, the first semiconductor base including a first plurality of semiconductor devices.

Example 18 includes the subject matter of any one of Examples 1-10, wherein the die is a second die, and wherein the semiconductor base is a second semiconductor base and includes a plurality of semiconductor devices, the integrated circuit further comprising a first semiconductor base below the one or more first interconnect layers, wherein the second die is oriented such that the one or more second interconnect layers of the second die are between the second semiconductor base and the first semiconductor base.

Example 19 includes the subject matter of any one of Examples 1-18, and further comprises one or more additional die in the one or more first interconnect layers.

Example 20 includes the subject matter of Example 19, wherein at least one of the one or more additional die is laterally adjacent the die.

Example 21 includes the subject matter of any one of Examples 19 or 20, wherein at least one of the one or more additional die occupies a higher or lower position, relative to the die, in the one or more first interconnect layers.

Example 22 includes the subject matter of any one of Examples 1-21, wherein the first electrical connections and the second electrical connections comprise one or more of eutectic bonds including copper and tin, copper-copper thermocompression bonds, a copper-copper thermal diffusion bond, and a polymer adhesive.

Example 23 is an integrated circuit comprising a first die including a first semiconductor base and an interconnect structure on the base; and a second die in the interconnect structure, wherein a portion of the interconnect structure is laterally adjacent to the second die. For example, the portion of the interconnect structure laterally adjacent to the second die includes a plurality of interconnect layers (or part thereof).

Example 24 includes the subject matter of Example 23, wherein the second die includes a second semiconductor base and layers of interconnect, the second semiconductor base including a plurality of transistors.

Example 25 includes the subject matter of Example 24, wherein the plurality of transistors is a second plurality of transistors, and wherein the first semiconductor base includes a first plurality of transistors.

Example 26 includes the subject matter of any one of Example 23-25, wherein the interconnect structure includes a plurality of interconnect layers, individual interconnect layers including an insulator material and one or more conductive features.

Example 27 includes the subject matter of Example 26, wherein the individual interconnect layers further include an etch-stop layer.

Example 28 includes the subject matter of any one of Examples 23-27, wherein the interconnect structure includes one or more conductive features.

Example 29 includes the subject matter of Example 28, wherein the one or more conductive features comprises copper.

Example 30 includes the subject matter of any one of Examples 28-29, wherein the one or more conductive features includes one or more horizontal conductor line in the portion of the interconnect structure laterally adjacent to the second die.

Example 31 includes the subject matter of any one of Examples 23-30, wherein a thickness of the second die is from 3 microns to 100 microns.

Example 32 includes the subject matter of Example 31, wherein the thickness of the second die is from 10 microns to 40 microns.

Example 33 includes the subject matter of any one of Examples 23-32, and further comprises an interlayer dielectric between the second die and layers of the interconnect structure that include the second die.

Example 34 includes the subject matter of any one of Examples 23-33, wherein the interconnect structure includes one or more local interconnect layers and the second die is embedded in the one or more local interconnect layers.

Example 35 includes the subject matter of any one of Examples 23-33, wherein the interconnect structure includes one or more global interconnect layers and the second die is embedded in the one or more global interconnect layers.

Example 36 includes the subject matter of any one of Examples 23-35, wherein the interconnect structure includes one or more interconnect layers above the second die.

Example 37 includes the subject matter of any one of Examples 23-36, wherein the bottom portion of the second die comprises layers of interconnect.

Example 38 includes the subject matter of any one of Examples 23-37, wherein the second semiconductor base of the second die comprises a bulk semiconductor.

Example 39 includes the subject matter of Example 38, wherein the bulk semiconductor comprises a Group III-V semiconductor material.

Example 40 includes the subject matter of Examples 38, wherein the bulk semiconductor comprises a Group IV semiconductor material.

Example 41 includes the subject matter of any one of Examples 23-38, wherein the first semiconductor base comprises single crystal silicon.

Example 42 includes the subject matter of any one of Examples 23-38, wherein the first semiconductor base comprises a first semiconductor material and the second semiconductor base comprises a second semiconductor material that is compositionally distinct from the first semiconductor material.

Example 43 includes the subject matter of Example 42, wherein the first semiconductor material comprises a Group IV material and the second semiconductor material comprises a Group III-V material.

Example 44 includes the subject matter of any one of Examples 23-42, wherein the second die is oriented such that the layers of interconnect of the second die are between the first semiconductor base and the second semiconductor base.

Example 45 includes the subject matter of any one of Examples 23-44, and further comprises one or more additional second die embedded in the interconnect structure.

Example 46 includes the subject matter of Example 45, wherein at least one of the one or more additional second die is laterally adjacent to the secondary die.

Example 47 includes the subject matter of any one of Examples 45 or 46, wherein at least one of the one or more additional second die occupies a higher or lower position, relative to the secondary die, in the interconnect structure.

Example 48 includes the subject matter of any one of Examples 45-47, wherein the second die is electrically coupled to the one or more additional second die via the interconnect structure.

Example 49 includes the subject matter of any one of Examples 23-48, and further comprises first electrical connections between the interconnect structure of the first die and the layers of interconnect of the second die; and/or second electrical connections between the interconnect structure of the first die and the second semiconductor base of the second die; wherein the first electrical connections and the second electrical connections comprise one or more of a eutectic bond including copper and tin, a copper-copper thermocompression bond, a coper-copper thermal diffusion bond, and a hybrid bond.

Example 50 includes any one of the Examples of Examples 23-49, wherein a first portion of the second die is electrically connected to a second portion of the second die via the interconnect structure.

Example 51 is an integrated circuit comprising a first die including a first semiconductor base and an interconnect structure on the first semiconductor base, the interconnect structure including a plurality of interconnect layers, and the first semiconductor base including a first plurality of transistors. A second die is in the interconnect structure, where the interconnect structure includes at least part of one or more interconnect layers laterally adjacent to the second die.

Example 52 includes the subject matter of Example 51, wherein the interconnect structure of the of the first die includes one or more interconnect layers above the second die.

Example 53 includes the subject matter of any one of Examples 51-52, wherein the interconnect structure includes one or more horizontal conductor lines in the interconnect layers laterally adjacent to the second die.

Example 54 includes the subject matter of any one of Examples 51-53, wherein the second die includes a second semiconductor base and layers of interconnect, the second semiconductor base including a second plurality of transistors.

Example 55 includes the subject matter of any one of Examples 51-54, and further comprises first electrical connections between the layers of interconnect of the second die and the interconnect structure of the first die; and/or second electrical connections between the semiconductor base of the second die and the interconnect structure of the first die.

Example 56 includes the subject matter of Example 55, wherein the first electrical connections and the second electrical connections comprise one or more of a eutectic bond including copper and tin, a copper-copper thermocompression bond, a copper-to-copper thermal diffusion bond, and a hybrid bond.

Example 57 includes the subject matter of any one of Examples 51-56, and further comprises a polymer adhesive between the bottom surface of the second die and the interconnect structure of the first die.

Example 58 includes the subject matter of any one of Examples 51-57, wherein the first semiconductor base comprises a Group IV material and the second semiconductor base comprises a Group III-V material.

Example 59 is a computing system comprising the integrated circuit of any one of Examples 1-58.

Example 60 is a printed circuit board comprising the integrated circuit of any one of Examples 1-58.

Example 61 is a microprocessor comprising the integrated circuit of any one of Examples 1-58.

Example 62 is a method of fabricating an integrated circuit, the method comprising fabricating first layers of an interconnect structure on a base; preparing first contacts on a topmost layer of the first layers of the interconnect structure; fabricating second layers of the interconnect structure on the first layers; defining a recess in the second layers of the interconnect structure, the recess exposing the first contacts on the topmost layer of the first layers; placing a secondary IC die in the recess; bonding the integrated circuit die to the first contacts to provide a bonded secondary IC die; and fabricating third layers of the interconnect structure over the bonded secondary IC die and the second layers of the interconnect structure.

Example 63 includes the subject matter of Example 62, wherein bonding the secondary IC die to the first contacts includes connecting the first contacts to interconnect of the secondary IC die.

Example 64 includes the subject matter of any one of Examples 62-63, and further comprises fabricating an interconnect via in one or more of the second layers of the interconnect structure, the interconnect via laterally adjacent the bonded secondary IC die.

Example 65 includes the subject matter of any one of Examples 62-64, wherein the semiconductor material of the base die is a first semiconductor material and the method further comprises making second contacts to an upper portion of the bonded secondary IC die, the upper portion comprising a second semiconductor material.

Example 66 includes the subject matter of Example 65, wherein the second semiconductor material comprises a Group III-V semiconductor material and the first semiconductor material comprises a Group IV semiconductor material.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
a first die including a semiconductor base, a device layer on the semiconductor base, and an interconnect structure having a plurality of interconnect layers, the interconnect structure directly on the device layer, wherein an edge of the interconnect structure is coplanar with an edge of the semiconductor base; and
a second die in the plurality of interconnect layers;
wherein the plurality of interconnect layers includes at least first and second horizontal interconnect layers, the second horizontal interconnect layer arranged over the first horizontal interconnect layer in a direction normal to the semiconductor base, and the first and second horizontal interconnect layers arranged laterally adjacent to the second die.

2. The integrated circuit of claim 1, wherein the interconnect structure includes one or more horizontal conductor lines in the at least first and second horizontal interconnect layers arranged laterally adjacent to the second die.

3. The integrated circuit of claim 1, wherein the semiconductor base is a first semiconductor base, and the second die includes a second semiconductor base and layers of interconnect, the second semiconductor base including a plurality of transistors.

4. The integrated circuit of claim 3, further comprising:

first electrical connections between the interconnect structure of the first die and the layers of interconnect of the second die; and/or second electrical connections between the interconnect structure of the first die and the second semiconductor base of the second die.

5. The integrated circuit of claim 1, wherein the plurality of interconnect layers includes one or more local interconnect layers and the second die is embedded in the one or more local interconnect layers.

6. The integrated circuit of claim 1, wherein the plurality of interconnect layers includes one or more global interconnect layers and the second die is embedded in the one or more global interconnect layers.

7. The integrated circuit of claim 1, wherein the plurality of interconnect layers includes one or more interconnect layers above the second die.

8. The integrated circuit of claim 1, further comprising one or more additional second die embedded in the plurality of interconnect layers.

9. The integrated circuit of claim 8, wherein the second die is electrically coupled to the one or more additional second die via the interconnect structure.

10. The integrated circuit of claim 1, wherein a first portion of the second die is electrically connected to a second portion of the second die via the interconnect structure.

11. An integrated circuit comprising:

a plurality of first interconnect layers;

a die in the plurality of first interconnect layers, such that at least first and second horizontal interconnect layers of the plurality of first interconnect layers are arranged with the second horizontal interconnect layer over the first horizontal interconnect layer and are arranged laterally adjacent to a side of the die, the die including a semiconductor base having a first surface and an opposite second surface, and one or more second interconnect layers above the first surface of the semiconductor base;

first electrical connections directly between the die and one or more of the plurality of first interconnect layers below the die; and second electrical connections directly between the second surface of the semiconductor base and one or more of the plurality of first interconnect layers above the die.

12. The integrated circuit of claim 11, further comprising an interlayer dielectric between the die and the first and second horizontal interconnect layers of the plurality of first interconnect layers laterally adjacent the die.

13. The integrated circuit of claim 11, wherein the die is a second die and the integrated circuit includes a first die below the plurality of first interconnect layers, wherein the plurality of first interconnect layers includes one or more local interconnect layers and the second die is in the one or more local interconnect layers, wherein there is no other interconnect layer between a local interconnect layer and the first die.

14. The integrated circuit of claim 11, wherein the die is a second die and the integrated circuit includes a first die below the plurality of first interconnect layers, wherein the plurality of first interconnect layers includes one or more local interconnect layers and one or more global interconnect layers and the second die is in the one or more global interconnect layers, wherein there is no other interconnect layer between the one or more local interconnect layers and the first die, and the one or more global interconnect layers is above the one or more local interconnect layers.

15. The integrated circuit of claim 11, wherein the first and second horizontal interconnect layers laterally adjacent to the side of the die each directly contact the side of the die.

16. The integrated circuit of claim 11, wherein the die is a second die, and wherein the semiconductor base is a second semiconductor base and includes a second plurality of semiconductor devices, the integrated circuit further comprising a first die including the plurality of first interconnect layers and a first semiconductor base that includes a first device layer, the first semiconductor base below the plurality of first interconnect layers, the first semiconductor base including a first plurality of semiconductor devices.

17. The integrated circuit of claim 11, further comprising one or more additional die in the plurality of first interconnect layers.

18. The integrated circuit of claim 17, wherein at least one of the one or more additional die occupies a higher or lower position, relative to the die, in the plurality of first interconnect layers.

19. An integrated circuit comprising:

a first die including a first semiconductor base and an interconnect structure on the first semiconductor base, wherein each of one or more outer edges of the interconnect structure is coplanar with a corresponding outer edge of the semiconductor base, the interconnect structure including a plurality of interconnect layers, and the first semiconductor base including a first plurality of transistors; and a second die in the interconnect structure, the second die including a second semiconductor base and layers of interconnect, the second semiconductor base including a second plurality of transistors;

wherein the interconnect structure includes first and second horizontal interconnect layers, the second horizontal interconnect layer arranged over the first horizontal interconnect layer and arranged laterally adjacent to the second die, and the interconnect structure includes one or more interconnect layers above the second die.

20. The integrated circuit of claim 19, further comprising:

first electrical connections between the layers of interconnect of the second die and the interconnect structure of the first die; and/or second electrical connections between the semiconductor base of the second die and the interconnect structure of the first die.

* * * * *